(12) United States Patent
Gaber et al.

(10) Patent No.: US 6,388,823 B1
(45) Date of Patent: May 14, 2002

(54) OPTICAL SYSTEM, ESPECIALLY A PROJECTION LIGHT FACILITY FOR MICROLITHOGRAPHY

(75) Inventors: Erwin Gaber, Heidenheim; Christian Wagner, Aalen; Hubert Holderer, Königsbronn; Michael Gerhard, Aalen; Erich Merz, Essingen; Jochen Becker, Oberkochen, all of (DE); Arie Cornelis Scheiberlich, Veldhoven (NL)

(73) Assignee: Carl-Zeiss-Stiftung trading as Carl Zeiss (DE)

( * ) Notice: Subject to any disclaimer, the term of this patent is extended or adjusted under 35 U.S.C. 154(b) by 0 days.

(21) Appl. No.: 09/486,017
(22) PCT Filed: Jun. 18, 1999
(86) PCT No.: PCT/EP99/04246
§ 371 Date: Jun. 22, 2000
§ 102(e) Date: Jun. 22, 2000
(87) PCT Pub. No.: WO99/67683
PCT Pub. Date: Dec. 29, 1999

(30) Foreign Application Priority Data

Jun. 20, 1998 (DE) .......................... 198 27 603

(51) Int. Cl.[7] ................................................ G02B 7/02
(52) U.S. Cl. ................................................ 359/819
(58) Field of Search ................................ 359/819, 820, 359/822, 811

(56) References Cited

U.S. PATENT DOCUMENTS

| | | | |
|---|---|---|---|
| 4,155,631 A | 5/1979 | Borsare et al. ............. | 359/847 |
| 4,226,507 A | * 10/1980 | Fuschetto .................... | 359/849 |
| 4,492,431 A | 1/1985 | Eitel et al. .................. | 359/849 |
| 4,993,823 A | 2/1991 | Schaffer, Jr. et al. ....... | 359/849 |
| 5,053,794 A | * 10/1991 | Benz ........................... | 396/432 |
| 5,457,577 A | * 10/1995 | Wilson ........................ | 359/827 |
| 5,822,133 A | 10/1998 | Mizuno et al. ............. | 359/696 |
| 5,986,827 A | * 11/1999 | Hale ........................... | 359/822 |

FOREIGN PATENT DOCUMENTS

| | | | |
|---|---|---|---|
| DE | 3404063 A1 | 2/1984 | .......... G03B/27/68 |
| EP | 0 660 169 A1 | 12/1994 | .......... G03B/27/52 |
| EP | 0 678 768 A2 | 4/1995 | .......... G03B/27/53 |
| WO | WO 96/13741 | 5/1996 | .......... G02B/15/14 |

OTHER PUBLICATIONS

Patent Abstract of Japan; Publication No. 11044834; date Feb. 16, 1999; Applicant Canon Inc.
Patent Abstract of Japan; Publication No. 10039208; date Feb. 13, 1998; Applicant Nikon Corp.
International Search Report, PCT/EP99/04246; published Dec. 29, 1999.

* cited by examiner

Primary Examiner—Ricky Mack

(57) ABSTRACT

An optical system, in particular a projection exposure device for microlithography, with a slit-shaped image field or illumination which is not rotationally symmetrical, has an optical element, in particular, a lens or a mirror which is arranged in a mount (2), and actuators (3) which engage on the optical element (1) at least approximately perpendicularly to the optical axis. The actuators (3) bring about forces and or moments, which are not rotationally symmetrical and which deviate from the radial, on the optical element (1), for the production of bendings which take place substantially without thickness changes.

13 Claims, 4 Drawing Sheets

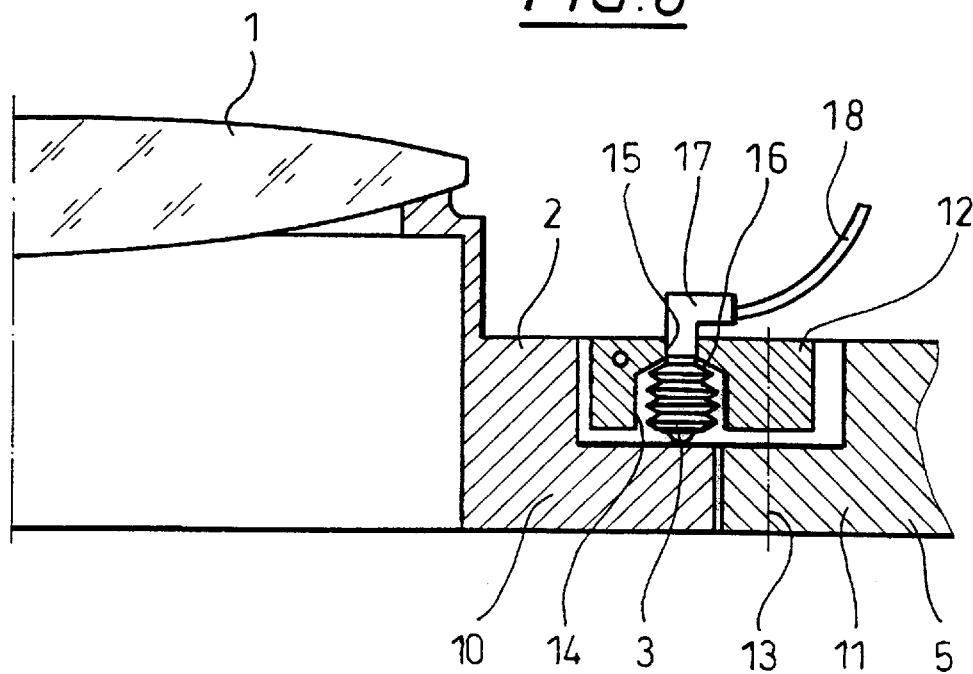
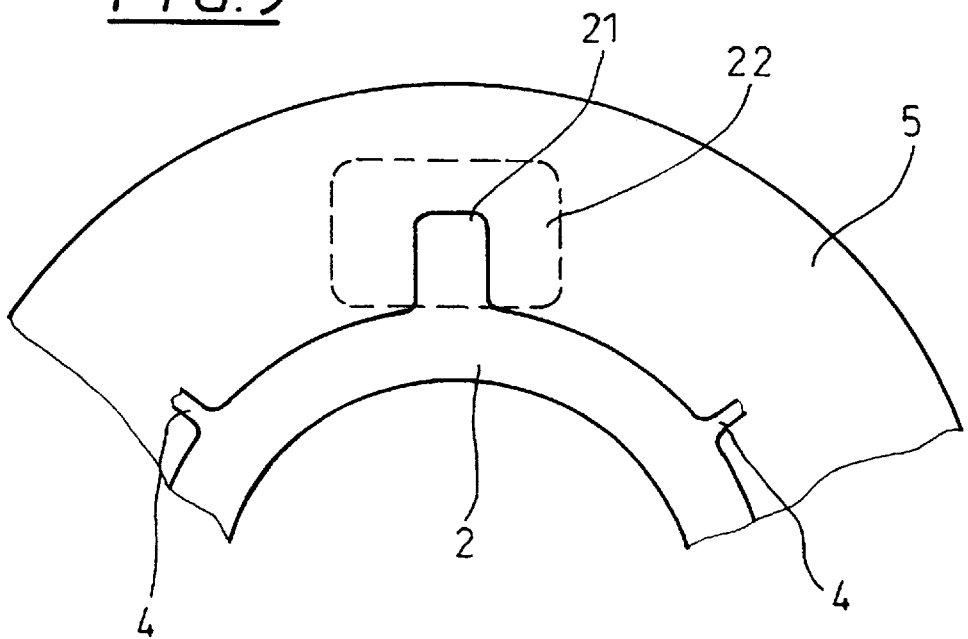

OPTICAL SYSTEM, ESPECIALLY A PROJECTION LIGHT FACILITY FOR MICROLITHOGRAPHY

The invention relates to an optical system, in particular a projection system for microlithography, in particular exposure with a slit-shaped image field or which is not rotationally symmetrical, which has an optical element, in particular, a lens or a mirror which is arranged in a mount, and actuators which engage a portion of the mount and/or the optical element.

An optical system of the kind mentioned hereinabove is described in EP 0 678 768 A2. Step and scan processes are used therein, whereby only a narrow, slit-shaped strip of a mask is transferred to a wafer. In order to expose the whole field, a reticle is used, and the wafer is displaced sideways (scanning).

However, it is disadvantageous in this case that a rotationally asymmetrical illumination impression arises, above all at the lens near the wafer, due to this slit geometry. This means that the temperature distribution on the lens arising due to the unavoidable lens heating is likewise rotationally asymmetrical and therefore leads, due to the linear dependence of refractive index on temperature and thermal expansion, to image errors, e.g., astigmatism, on the optical axis.

In 193 nm lithography, the 193 nm light passing through the quartz glass lenses leads to a volume decrease of the quartz glass, increasing monotonically with $NI^2$. Here N is the number of laser pulses and I is the pulse dose. Furthermore, an increase of refractive index results. Since the increase of refractive index overcompensates for the decrease of optical path length due to the shrinkage, the consequence of this effect termed compaction is a disturbance of the wavefront. This leads, just like a lens heating, to image errors such as astigmatism on the optical axis.

In contrast to a compensation of the lens heating, there is no passive compensation for the compaction effect. Here the change of the wavefront had to be compensated actively, by changing a lens element. Since it is not possible to use an active mirror in a refractive design (the cost of introducing an additional mirror for image error compensation in general excludes this), one or more lenses have to be used as "adjusting members". In order to correct astigmatism on the axis, movements along the optical axis, and also decentering, are excluded. Hence all translational degrees of freedom are unavailable as possibilities for a correction.

In EP 0 678 768 it has now been proposed to use a lens as the "adjusting member", in order to correct the image errors produced by a non-uniform heating of the lens. For this purpose, it is provided according to FIG. 11 to allow forces acting in the radial direction to act on the lens. However, only an asymmetrical change of thickness is produced by the pressure forces thus produced on the lens.

In EP 0 660 169 A1, a projection exposure device for microlithography is described, in which the objectives are provided with correction elements. For this purpose, among other things, a lens pair is provided, which is rotatable around the optical axis. The refractive power is thereby altered by the shape of the lens by the superposition of a cylindrical meniscus shape over a spherical lens.

The present invention has as its object to provide an optical system of the kind stated at the beginning, in which the image errors unavoidably arising due to the non-uniform temperature distribution can be corrected or minimized with simple means.

According to the invention, this object is attained by the features stated in the characterizing portion of claim 1.

In contrast to the prior art, not only are pressure forces produced which result solely in an asymmetrical thickness change, but also a bending of the optical element, for example, a lens, is brought about by means of the thrust forces or torsion which re produced, and is chosen so that the unavoidably arising image errors are compensated to the greatest possible extent. With the actuators according to the invention, an optical element, such as for example a lens, can be controllably deformed by a few 100 nm up to $\mu$m. In this manner, for example, a compensation of astigmatism $r^2$ and $r^4$ can be attained.

In the process according to the invention, the desired temperature distributions can be quickly and reliably attained with simple means. This is in particular the case when only certain image errors, for example, image errors of low order, are to be corrected.

A further very important advantage of the invention is that if necessary "overcompensations" and the additional compensation of production errors are possible. Instead of a symmetrizing of several individual lenses, as is the case in the prior art, it is also possible to "overcompensate" individual lenses, i.e. to intentionally make the temperature distribution or deformation asymmetrical "in another direction". In this manner, the overall result is a compensation of the whole objective or of the illumination device.

As regards the compensation of production errors, there are two variants, namely a simultaneous compensation of inadvertent production errors and an intentional building in of a fixed deflection, in order to halve the required amount of correction.

With the process according to the invention, a simultaneous compensation is possible of lens heating and of the compaction effect of the optical element.

The optical system according to the invention can be used with particular advantage in semiconductor lithography, since the image errors arising due to the progressive scaling down of the structures to be imaged likewise have to be minimized.

With the actuators according to the invention, an astigmatism can be controllably produced for the compensation of the thermal astigmatism and the effects due to compaction in the optical element, e.g., a lens.

It is also of advantage that it is furthermore possible, in dependence on the arrangement and number of actuators, to produce other deformations of the optical element.

Advantageous embodiments of the invention will become apparent from the dependent claims and from the embodiment examples described in principle hereinbelow with reference to the drawing.

FIG. 1 shows a schematic plan view of an optical element with actuators according to the invention, FIG. 2 shows a cross section along the line II—II of FIG. 1, FIG. 3 shows a second embodiment example for an optical element with actuators according to the invention, FIG. 4 shows a cross section along the line IV—IV of FIG. 4, FIG. 5 shows a third embodiment example for an optical element with actuators according to the invention, FIG. 6 shows a cross section along the line VI—VI of FIG. 5, and FIG. 7 shows a half-section corresponding to the cross sections according to FIGS. 2, 4 and 6, in a further embodiment of actuators.

FIG. 8 shows a half section through a fifth embodiment example of an optical element with actuators according to the invention.

FIG. 9 shows a partial plan view of a one-piece constitution of a mounting ring and a frame jointed to this, as an alternative to the two-part constitution shown in FIG. 8.

Figure 1:
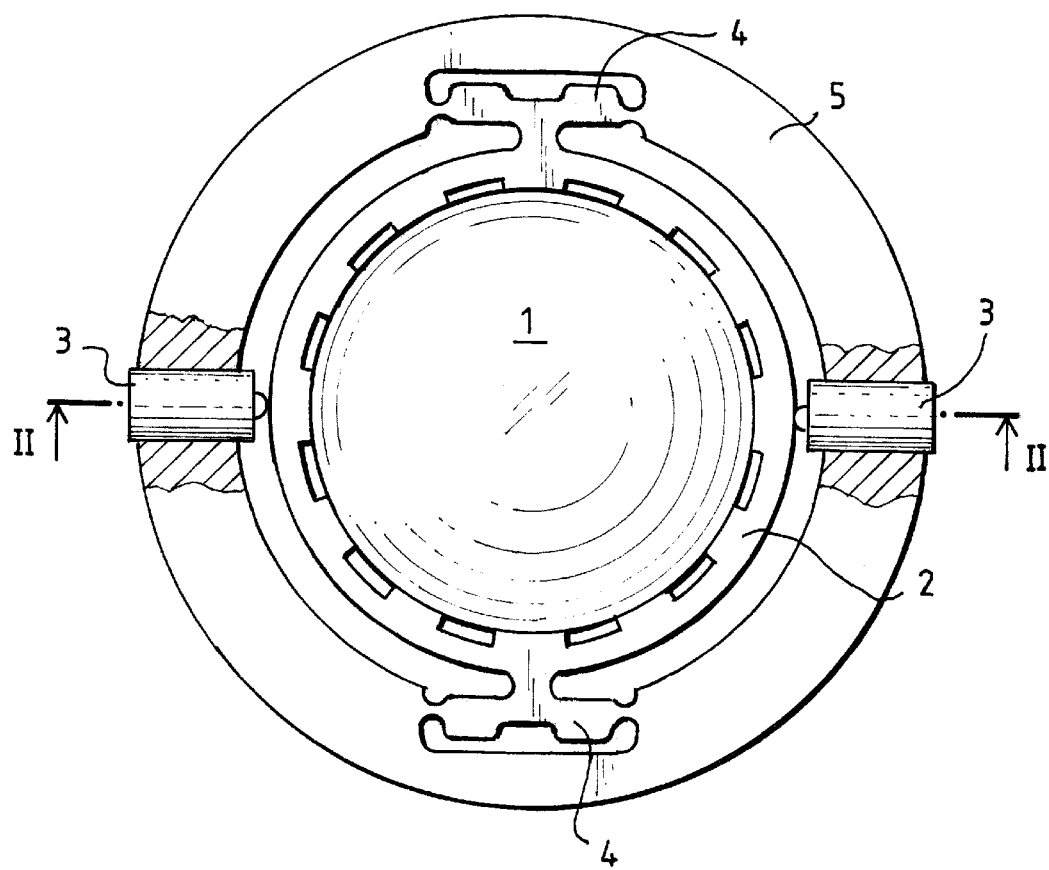

Since a projection exposure device is generally known in microlithography, there will only be described hereinbelow an optical element thereof, namely a lens 1 which is held in a deformable mount ring 2 as a mount. Actuators 3 in the form of adjusting screws are arranged in a frame 5 which surrounds the mount ring 2. Two opposed joints 4 produce the connection between the mount ring 2 and the frame 5. For stabilizing along the optical axis, further joints 4 with high stiffness can if necessary be arranged along the optical axis. As is evident from the embodiment example according to FIGS. 1 and 2, two actuators 3 are situated diametrically opposite each other.

Figure 2:
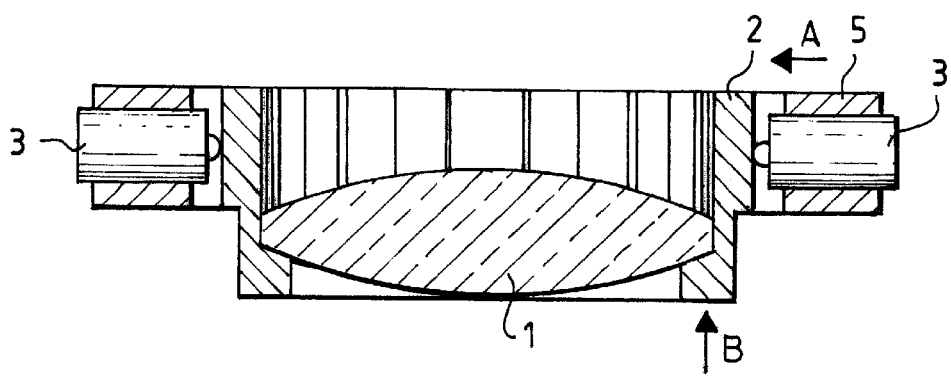

As can be seen in FIG. 2, the mount ring 2 has a pot shape with an open floor, the two actuators 3 being arranged on the upper edge and producing a radial force. The lens 1 abuts on a wedge-shaped lower floor edge of the mount ring 2, whereby bending moments in the direction of the arrow B parallel to the optical axis are produced on the lens by the application of forces by means of the actuators 3 in the direction of the arrow A according to FIG. 2. The actuators, embodied as adjusting screws, can be actuated hydraulically, or in other ways if required. As is evident, they controllably introduce a moment into the deformable mount ring 2, leading to a deformation in the sense of a bending of the lens 1.

Figure 3:
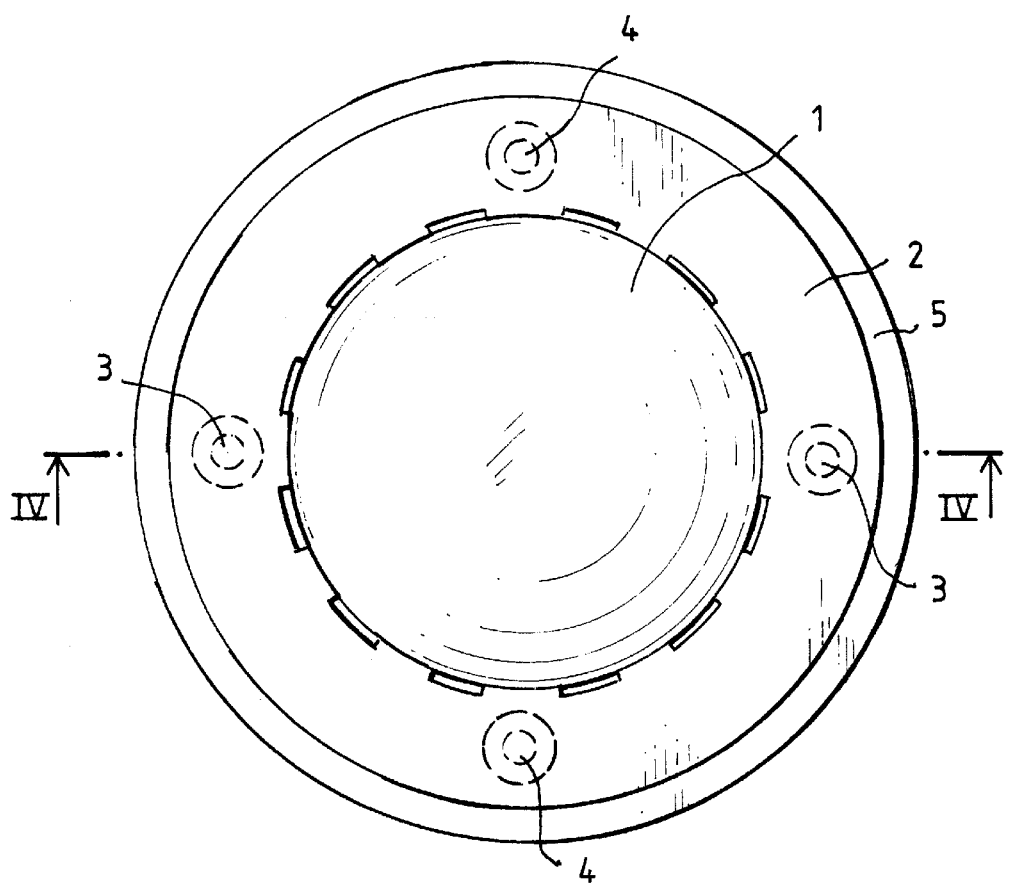
Figure 4:
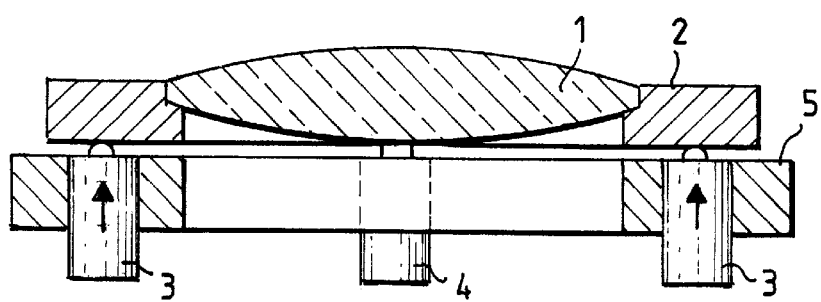

FIGS. 3 and 4 show a frame 5, wherein likewise, as in the embodiment example according to FIGS. 1 and 2, a moment is introduced into a deformable mount ring 2. As can be seen in particular from FIG. 4, the frame 5 and the mount ring 2 are then situated one behind the other, partially parallel to the optical axis, so that in this case the two mutually opposite actuators 3 are also situated with their longitudinal axes parallel to the optical axis and in this manner can likewise produce forces directed likewise parallel to the optical axis.

Fixing or clamping places 4 (not shown in more detail) are provided for connection of the frame 5 with the mount ring 2, and are respectively displaced by 90° with respect to the actuators. Differing from the embodiment example of FIGS. 1 and 2, the mount ring 2 is then held fast at two opposed places on the frame 5, and is bent along the optical axis at the places which are turned through 90°.

Figure 5:
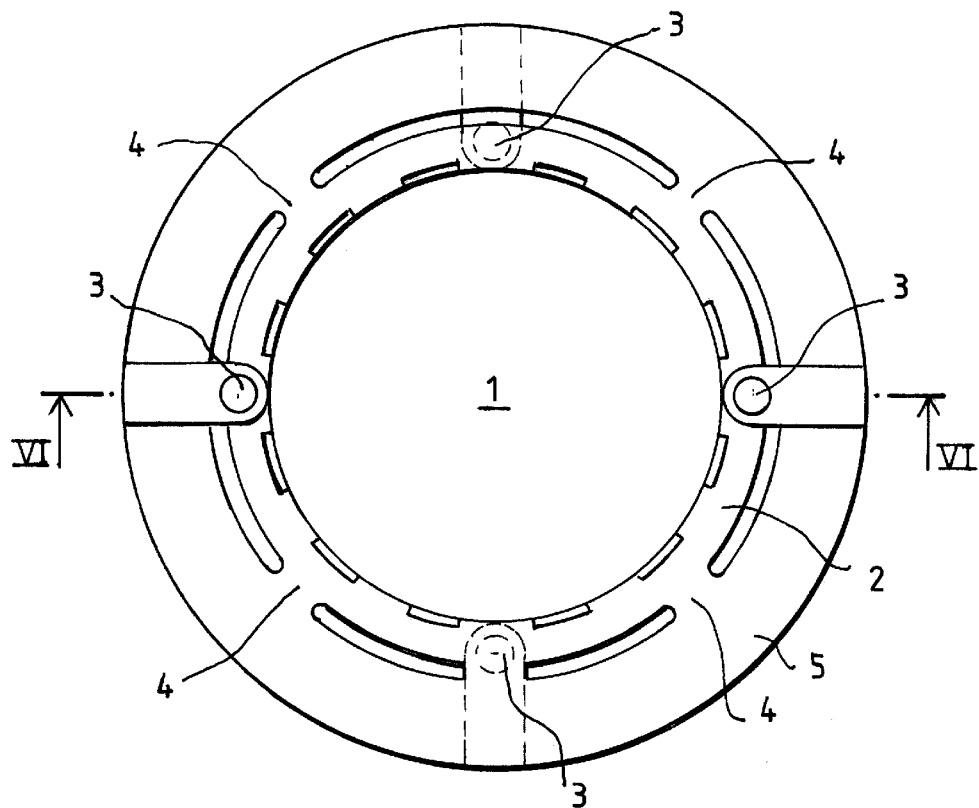
Figure 6:
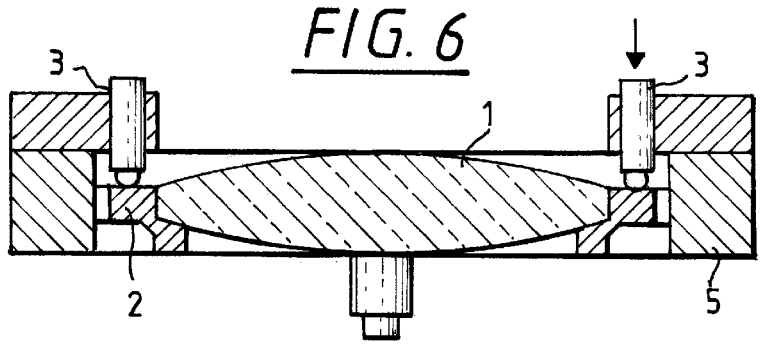

The embodiment example shown in FIGS. 5 and 6 leads to a smaller displacement along the optical axis, since here there is simultaneous pressure downward at two mutually opposite places, and respectively displaced by 90° thereto, upward by the correspondingly arranged actuators 3. As is evident, as in the embodiment example according to FIGS. 3 and 4, e.g., horizontally mutually opposed actuators then produce downward-directed bending moments, while the vertically mutually opposed actuators 3 produce upward-directed bending moments on the lens 1. The connection between the mount and the frame takes place by means of four joints 4, which are arranged, symmetrically distributed on the periphery, respectively between the actuators 3.

Figure 7:
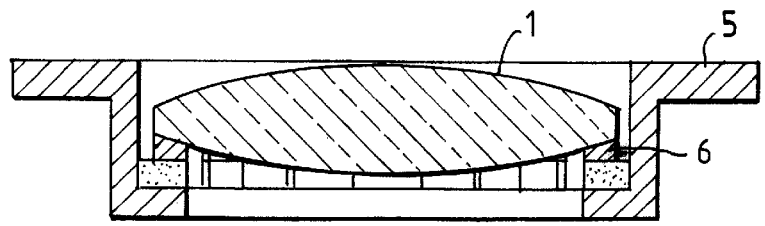

FIG. 7 shows in principle, in a half-section, actuators 3 which are embodied as piezoelectric elements. A greater number of actuators or piezoelectric elements 3, for example twenty, can then be distributed on an annular shoulder of the frame 5 or of the mount 2, such that upon their piezoelectric activation they exert on the lens 1 given forms of bending moments corresponding to their distribution over the periphery. For moment introduction a wedge-shaped lens seating 6 is located for this purpose as an intermediate member between the piezoelectric element 3 and the lens 1.

By means of the greater number of piezoelectric elements as the actuators 3, and their optional distribution over the periphery, there can be produced, or possibly superimposed, optional directions of astigmatism, 3-waviness, and other effects, such as e.g. cylindrical lens effect.

FIG. 8 shows a partial section through a further embodiment example. There can again be seen the lens 1 which is held in a deformable mounting ring 2, and also the frame surrounding the mounting ring 2. The mounting ring 2 has at its outer periphery an edge flange 11 of the same thickness, such that an annular, groove-like recess arises between the mounting ring 2 and the frame 5.

An annular actuator holder 12 is inserted into this groove-like recess, and is screwed to the edge flange 11 of the frame 5, as is indicated by the reference number 13. The actuator holder 11 is distributed over the periphery at several places, e.g., at two diametrically opposed places, provided with cylindrical receiving openings 14 which respectively connect, via a through bore 15 of smaller diameter, to the upper side of the actuator holder 11. An annular shoulder 16 arises in this manner between the receiving opening 14 and the through bore 15.

A pneumatic bellows 3 is located in each receiving opening 14, and serves as the actuator in this embodiment example. The underside of this bellows 3 abuts on the annular flange 10 of the deformable mounting ring 2; an annular, upper end face of the bellows 3 abuts on the step 16 between the receiving opening 14 and the through bore 15 of the actuator holder 11. An angled connection 17 for the bellows 3 is passed through the passage opening 16 and is connected to a flexible tube 18 by means of which gas is supplied under pressure.

Pressure regulation of the gas can take place in the following manner:

In the simplest case, a single gas pressure sensor is directly fitted to the regulating valve (not shown) and/or to the mounting ring 2, and provides a response regarding the gas pressure actually attained in the bellows 3. Alternatively, a path sensor (not shown) can be fitted to the mounting ring 2, determines the actual deformation of the mounting ring 2, and correspondingly informs the control. This path sensor can function capacitively, for example.

Both the gas pressure regulation via the gas pressure sensor and also the path measurement by means of the path sensor can be increased in their accuracy by the provision of multiple sensors. For example, four gas pressure sensors can be present, their signals being correlated in the controller with four calibrated gas pressure curves which are stored there and which relate the gas pressure at any given time to the deformation which is produced. Correspondingly, four path sensors can also be arranged on the mounting ring 2.

The connection between the mounting ring 2 and the frame 5 again takes place by means of joint-like devices, which are provided in the angle region between the bellows 3.

The connection between the mounting ring 2 and frame 5 is effected particularly elegantly in the embodiment according to FIG. 9. The mounting ring 2 and the frame 9 are produced here from a unitary workpiece, which in the form shown is divided functionally by slots 20 into the two components 2 and 5. The slots 20 can be produced by electro-erosion, for example. They substantially follow a circle, the midpoint of which is situated on the axis of the optical system, and at their adjacent ends they bend aside, slightly radially outward. Material bridges 4, which serve as deformable hinges, thus arise between the mounting ring 2 and the frame 5. The slots 20 are formed with radially projecting tongues 21, offset by 90° with respect to the material bridges 4. A bellows, such as shown in FIG. 8, acts on these tongues 21, respectively from the side situated behind the plane of the drawing. This bellows is installed, with its own actuator carrier, which this time is not annular, in a pocket 22 (shown dashed) machined into the end face of the mounting ring 2 and frame 5 which is situated behind the plane of the drawing.

The use of pneumatically actuated bellows 3 as the actuators has the advantage, as against the embodiment examples described earlier herein, of a simple mechanical principle which requires no guides and is therefore substantially free from friction and wear, and also the advantage of a high adjustment speed.

With the actuators described hereinabove it is possible to deform lenses 1 with respect to a mount such that imaging errors of surface errors of other lenses can be compensated. This means that an "overcompensation" is carried out on one lens or on a few lenses 1. The imaging quality of the whole objective is thereby improved. Furthermore, changes of the refractive index due to compaction in quartz or due to heating of the lens in operation can be compensated such that the optical quality is insured over the whole life of the objective.

In general, a lens 8 will be used in the upper third of the objective for a deformation, for which the ratio of the bundle diameter of the light pencil to the lens diameter provides the correct ratio of distortion action to astigmatism action. Furthermore, the course of the field is to be manipulated by means of the bundle diameter. For a lens in the diaphragm space, there results an astigmatism which is constant over the image field and no distortion action. For a lens very close to the reticle, there results a distortion anamorphism, but only a very small astigmatism action.

The actuators, in particular the piezoelectric elements, can be provided with a transmission, e.g., linear or lever transmission for gearing down or up. Solid-state joints can advantageously be used for this purpose.

What is claimed is:

1. An optical system comprising:
    an optical element,
    a deformable mount in which said optical element is arranged, and,
    a plurality of actuators that engage a portion of at least one of said deformable mount and said optical element,
    wherein said plurality of actuators bring about at least one of forces and moments, which are not rotationally symmetrical and deviate from a radial direction, onto said optical element for generating bendings that result substantially without thickness changes, and
    wherein said plurality of actuators engage on said deformable mount in a manner such that said deformable mount produces at least one of thrust forces and bending moments on said optical element.

2. The optical system according to claim 1, wherein said plurality of actuators comprise at least two actuators that are mutually oppositely situated.

3. The optical system according to claim 1, wherein said plurality of actuators comprise hydraulically mechanically or electrically actuating adjusting members.

4. The optical system according to claim 1, wherein said plurality of actuators comprise transmissions.

5. The optical system according to claim 4, wherein said transmissions have solid state joints.

6. The optical system according to claim 1, comprising a projection exposure device for microlithography wherein said optical element comprises one of a lens or a mirror arranged on said deformable mount.

7. The optical system according to claim 1, having a slot-shaped image field.

8. An optical system comprising:
    an optical element,
    a deformable mount in which said optical element is arranged, and,
    a plurality of actuators that engage a portion of at least one of said deformable mount and said optical element,
    wherein said plurality of actuators bring about at least one of forces and moments, which are not rotationally symmetrical and deviate from a radial direction, onto said optical element for generating bendings that result substantially without thickness changes, and
    wherein said plurality of actuators comprise two mutually opposite first actuators that produce at least one of first thrust forces and first moments running parallel to the optical axis of said optical element, and two second actuators, respectively displaced at 90° to said first actuators, which produce at least one of second thrust forces and second moments directed opposed to said first thrust forces and first moments.

9. An optical system comprising:
    an optical element,
    a mount in which said optical element is arranged, and,
    a plurality of actuators that engage a portion of at least one of said mount and said optical element,
    wherein said plurality of actuators bring about at least one of forces and moments, which are not rotationally symmetrical and deviate from a radial direction, onto said optical element for generating bendings that result substantially without thickness changes,
    wherein said plurality of actuators comprise a plurality of piezoelectric elements that engage said optical element at least one of directly or via an intermediate member, and
    wherein said plurality of piezoelectric elements are distributed on the periphery of said mount such that said plurality of piezoelectric elements produce at least one of thrust forces and moments that are directed at least approximately parallel to the optical axis of said optical element.

10. The optical system according to claim 9, further comprising a lens seating arranged between said plurality of piezoelectric elements and said optical element.

11. An optical system comprising:
    an optical element,
    a mount in which said optical element is arranged, and,
    a plurality of actuators that engage a portion of at least one of said mount and said optical element,
    wherein said plurality of actuators bring about at least one of forces and moments, that are not rotationally symmetrical and deviate from a radial direction, onto said optical element for generating bendings that result substantially without thickness changes,
    wherein said plurality of actuators comprise a plurality of piezoelectric elements that engage said optical element at least one of directly or via an intermediate member,
    further comprising a lens seating arranged between said plurality of piezoelectric elements and said optical element, and
    wherein said lens seating comprises at least approximately a wedge shape.

12. An optical system comprising:

an optical element, a mount in which said optical element is arranged, and, a plurality of actuators that engage a portion of at least one of said mount and said optical element, wherein said plurality of actuators bring about at least one of forces and moments, which are not rotationally symmetrical and that deviate from a radial direction, onto said optical element for generating bendings that result substantially without thickness changes, and wherein said plurality of actuators comprise pneumatic bellows that engage said optical element by one of directly or via intermediate members.

13. An optical system comprising:

an optical element, a deformable mount in which said optical element is arranged, and a plurality of actuators that engage a portion of at least one of said deformable mount and said optical element, wherein said plurality of actuators bring about at least one of forces and moments, which are not rotationally symmetrical and deviate from a radial direction, onto said optical element for generating bendings that result substantially without thickness changes, further comprising a lens seating having at least approximately a wedge shape, arranged between said plurality of actuators and said optical element.

* * * * *